United States Patent [19]
Maurelli et al.

[11] Patent Number: 5,479,367
[45] Date of Patent: Dec. 26, 1995

[54] N-CHANNEL SINGLE POLYSILICON LEVEL EPROM CELL

[75] Inventors: Alfonso Maurelli, Sulbiate; Carlo Riva, Monza, both of Italy

[73] Assignee: SGS-Thomson Microelectronics s.r.l., Milan, Italy

[21] Appl. No.: 232,696

[22] Filed: Apr. 25, 1994

Related U.S. Application Data

[62] Division of Ser. No. 734,907, Jul. 24, 1991, Pat. No. 5,307,312.

[30] Foreign Application Priority Data

Jul. 24, 1990 [EP] European Pat. Off. .............. 90830343

[51] Int. Cl.$^6$ .............................. H01L 25/04; H01L 27/10
[52] U.S. Cl. ..................... 365/182; 257/314; 257/336; 257/327; 257/344; 257/408
[58] Field of Search ...................................... 365/182, 185, 365/900; 257/314, 336, 327, 344, 408

[56] References Cited

U.S. PATENT DOCUMENTS

| 4,649,520 | 3/1987 | Boaz . | |
|---|---|---|---|
| 5,229,631 | 7/1993 | Woo | 257/314 |
| 5,301,150 | 4/1994 | Sullivan | 365/185 |
| 5,307,312 | 4/1994 | Maurelli et al. | 365/182 |
| 5,331,590 | 7/1994 | Josephson et al. | 365/185 |

FOREIGN PATENT DOCUMENTS

| 0347148 | 12/1989 | European Pat. Off. . |
|---|---|---|
| 1-248669 | 10/1989 | Japan . |

OTHER PUBLICATIONS

Yoshikawa et al, "An EPROM Cell Structure for EPLD's Compatible with Single Poly-Si Gate Process".
Julian J. Sanchez et al., "Drain-Engineered Hot-Electron-Resistant Device Structures: A Review" *IEEE Transactions on Electron Devices* vol. 36, No. 6, 1125–1132, Jun. 1989.
Patent Abstracts of Japan vol. 10, No. 129, (E-403) (2186) May 14, 1986.
Kuniyoshi Yoshikawa et al., "An EPROM Cell Structure for EPLDs Compatible with Single Poly Gate Process" *Japanese Journal of Applied Physics: Supplements* 18th Int. Conf. on Solid State Devices (1986) Aug. 20–22, Tokyo, Japan.
P. J. Cacharelis et al., "A Modular 1 micron CMOS Single Polysilicon EPROM PLD Technology" *Technical Digest of the IEDM*, pp. 60–63 San Francisco, Calif.; Dec. 11–14, 1988.
David H. K. Hoe et al., "Cell and circuit Design for Single-Poly EPROM" *IEEE Journal of Solid-State Circuits*, vol. 24, No.4, pp. 1153–1157 Aug. 1989.

*Primary Examiner*—Viet Q. Nguyen
*Attorney, Agent, or Firm*—David V. Carlson; Seed and Berry

[57] ABSTRACT

The process provides for the simultaneous N+ type implantation of areas of a semiconductor substrate of type P for the formation of a control gate and of highly doped regions of source and drain, defining a channel region. After oxide growth there is executed the deposition and the definition of a polysilicon layer, one region of which constitutes a floating gate above the control gate and the channel region and partially superimposed over the regions of source and drain.

6 Claims, 2 Drawing Sheets

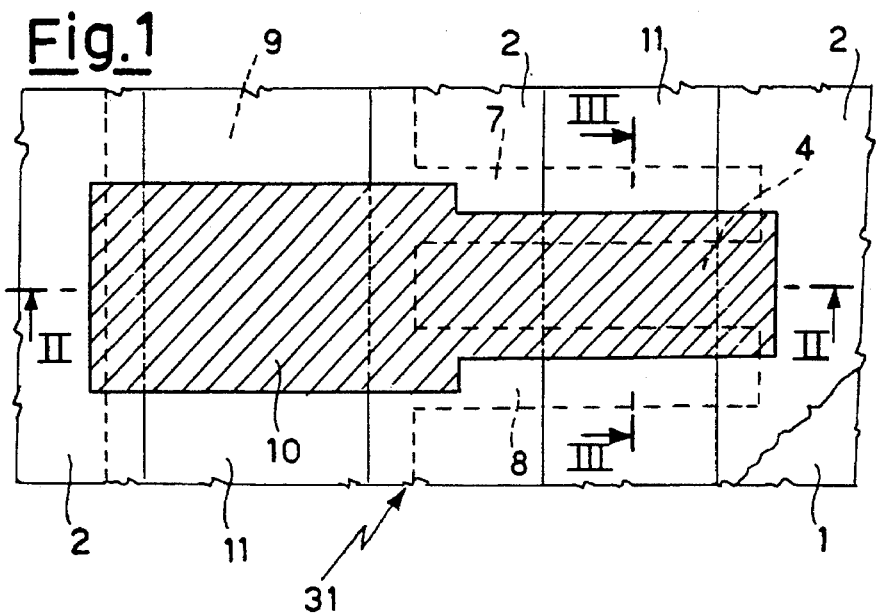
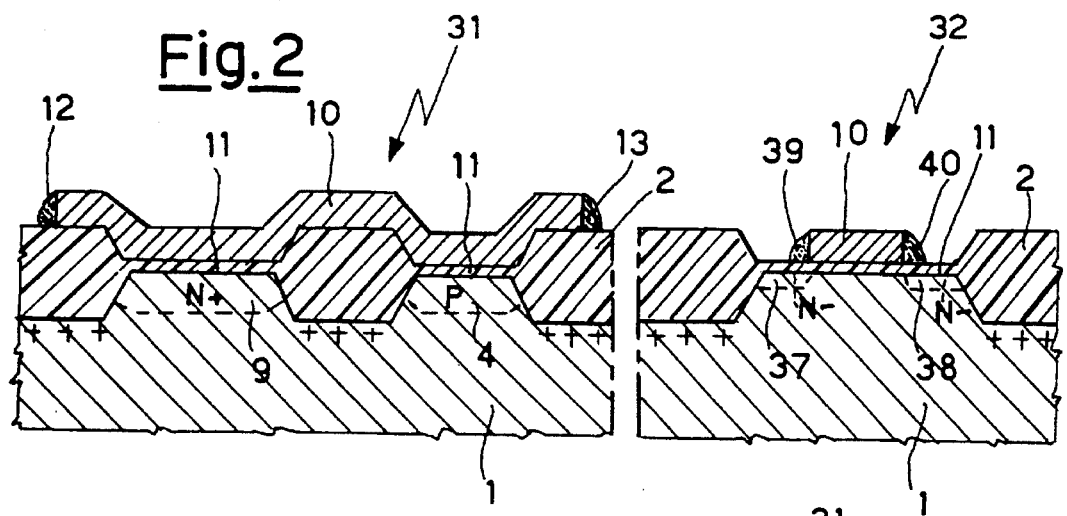
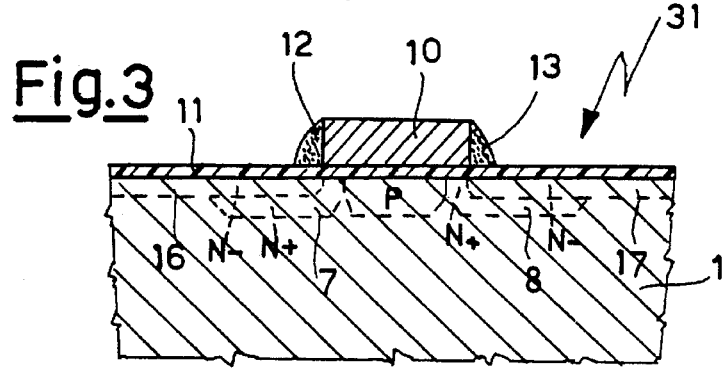

N-CHANNEL SINGLE POLYSILICON LEVEL EPROM CELL

CROSS-REFERENCE TO RELATED APPLICATION

This application is a division of U.S. Ser. No. 07/734,907, filed on Jul. 24, 1991, and entitled "Process for Obtaining an N-Channel Single Polysilicon Level EPROM Cell and Cell Obtained By Such Process" (U.S. Pat. No. 5,307,312).

FIELD OF THE INVENTION

The present invention relates to a process for obtaining an N-channel single polysilicon level PROM cell and a cell obtained with said process.

BACKGROUND OF THE INVENTION

It is known that for some applications it is preferable to use single polysilicon level EPROM cells (that is, with the floating gate coupled capacitatively to doped source and drain regions of a semiconductor substrate and to a control gate also constituted by a doped region of the same substrate) rather than the more traditional twin polysilicon level EPROM cells.

The custom is also known of accomplishing simultaneously with the cells of an EPROM memory matrix the transistors of an external circuit.

When very small transistors are needed, these can be accomplished with either the LDD (light doped drain) or the DDD (double doped drain) technology, that is, with the formation, on both sides of the floating gate, of oxide spacers superimposed over lightly doped substrate regions adjacent to highly doped source and drain regions.

In this way it is possible to reduce the problems of aging of traditional transistors, while still maintaining the electrical continuity necessary for the transistor's correct operation.

This technology is not applicable to EPROM cells, because the presence of such lightly doped regions would make the writing process extremely slow.

For a normally-fast writing process it is indeed necessary for the EPROM cells to have their floating gate partially superimposed over highly doped source and drain regions.

In order to accomplish a matrix of traditional single polysilicon level EPROM cells simultaneously with LDD- or DDD-type external circuit transistors it is, on the other hand, necessary to use an additional mask with a consequent increase in time and costs.

SUMMARY OF THE INVENTION

The object of the present invention is to accomplish a process for obtaining a single polysilicon level EPROM cell with the floating gate partially superimposed over double doped source and drain regions which, within the scope of a process for obtaining LDD- or DDD-type transistors, does not require the use of an additional mask.

According to the invention such object is attained by means of a process for obtaining an N-channel single polysilicon level EPROM cell, characterized in that it comprises the simultaneous N+ type implantation of semiconductor substrate areas of type P for the formation of a control gate and of highly doped regions of source and drain, defining a channel region, the growth of oxide on said highly doped areas, the deposition and definition of a polysilicon layer one region of which constitutes a floating gate above the control gate and the channel region with partial superimposition of the regions of source and drain, the N− type implantation of portions of said regions of source and drain located at the sides of said floating gate and the formation of oxide spacers partially superimposed over said portions of regions of source and drain at the sides of said floating gate.

In this way it is possible to obtain in an integrated form and without an additional mask an N-channel single polysilicon level EPROM cell with its floating gate partially superimposed over highly doped source and drain regions, and thus capable of guaranteeing a very good performance in terms of writing speed and current absorption, simultaneously with LDD- or DDD-type external circuit transistors, that is, with lightly doped regions under oxide spacers located at the sides of the floating gate.

This is obtained because the high dope implantation utilized for the control gate is also used for the source and drain regions and thus it simultaneously defines the cell channel.

The features of the present invention shall be made more evident by an embodiment illustrated as a non-limiting example in the enclosed drawings.

BRIEF DESCRIPTION OF THE DRAWINGS

FIG. 1 illustrates a single polysilicon level EPROM cell obtained with the process according to the invention;

FIG. 2 is a cross-sectional view taken along the Line II—II of FIG. 1, completed with a similar cross-sectional view of an external circuit transistor;

FIG. 3 is a cross-sectional view taken along the Line III—III of FIG. 1;

DETAILED DESCRIPTION OF THE PREFERRED EMBODIMENT

Figure 4:
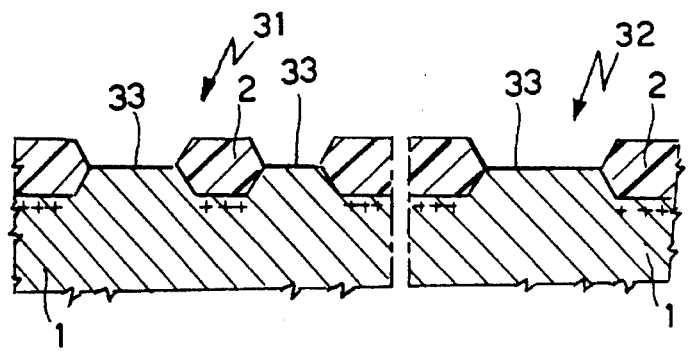
FIGS. 4 to 7 show steps of a process for accomplishing a single polysilicon level EPROM cell and an external circuit transistor, seen in a cross-sectional view similar to that of FIG. 2.

With reference to the above figures, where there is indicated with 31 an area of an N-channel single polysilicon level EPROM cell and with 32 an area of an external circuit transistor, the process according to the present invention provides for both areas the preliminary formation, illustrated in FIG. 4, of areas of field oxide 2 on a semiconductor substrate 1 of type P, for example of boron, with the simultaneous definition of active areas 33.

Figure 5:
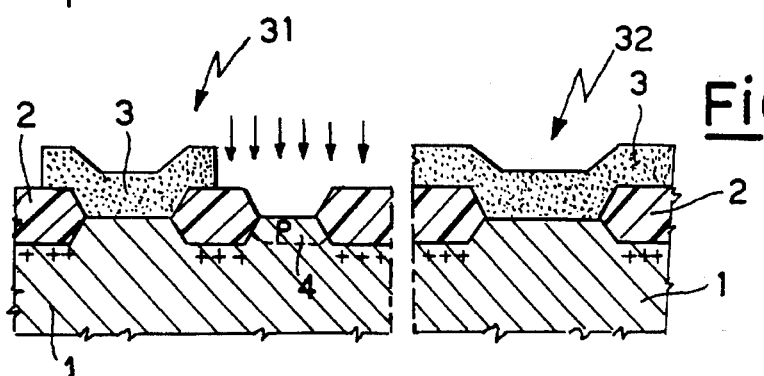

As illustrated in FIG. 5, after the application of a resist mask 3 there is executed an implantation of type P in a channel region 4 of cell 31 with the purpose of raising the threshold voltage of the cell itself.

Figures 6, 8:
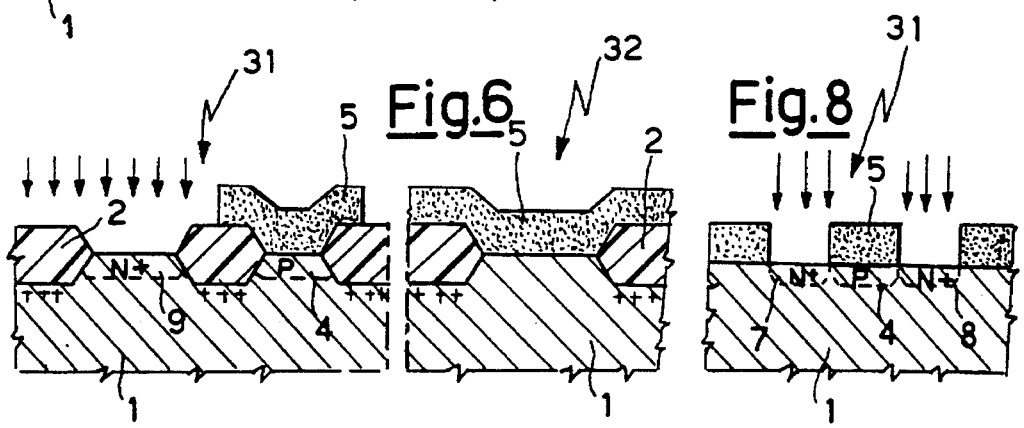
FIGS. 8 and 9 show steps of a process similar to those of FIGS. 6 and 7, seen in a cross-sectional view similar to that of FIG. 3.

With reference to FIGS. 6 and 8, the mask 3 is subsequently replaced by another resist mask 5 and there is executed in the area of cell 31 an implantation of type N+, for example of arsenic with an implant dose of from 1E14 to 1E15 atoms/cm$^2$, for the creation of a control gate 9 and of highly doped regions of source 7 and drain 8, defining the channel region 4.

Figures 7, 9:
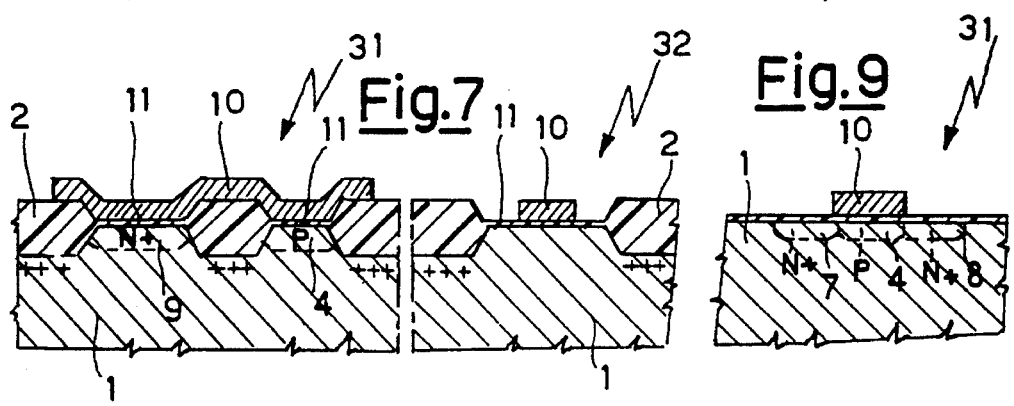

With reference to FIGS. 7 and 9, once the mask 5 is removed there is executed in both areas 31 and 32 a growth of gate oxide 11 which in the area above the control gate 9 has a greater thickness than in the area above channel region 4 of cell 31 and the corresponding region of cell 31, given the greater concentration of dope in the first area with respect to the others and given that, as is known, the thicknesses of the oxide also depend on the concentration of dope in the regions below.

There follows the deposition of a layer of polysilicon (or polysilicide) 10, a region of which, after suitable definition, constitutes the floating gate of cell 31, above the control gate 9 and the channel region 4 with partial superimposition of the regions of source 7 and drain 8, while a region forms the gate of transistor 32.

Lastly, as shown in FIGS. 2 and 3, there is provided an implantation N– (preferably of phosphorus with an implantation dose of from 5E12 to 5E13 atoms/cm$^2$) of portions of the regions of source 7 and drain 8 with the formation of respective regions 16, 17 aligned with floating gate 10, and the formation of upper oxide spacers 12, 13 at the sides of the floating gate. A similar implantation of type N– is simultaneously executed in the area of transistor 32 for the creation of corresponding source and drain regions 37 and 38 and similar spacers 39 and 40 are created at the sides of the gate of transistor 32.

There is thus obtained the EPROM cell 31 shown in FIGS. 1—3, and simultaneously the circuit transistor 32 shown in FIG. 2.

In a manner well known in the prior art, both cell 31 and transistor 32 are then completed with N+ implantations self-aligned with spacers 12, 13 and 39, 40 in regions 16, 17 and 37, 38, respectively.

We claim:

1. An N-channel single polysilicon level EPROM cell comprising a P-type semiconductor substrate, heavily doped N+ source and drain regions provided at surface portions of the substrate and defining a channel region therebetween, a heavily doped N+ control gate region provided at a further surface portion of the substrate, a gate oxide layer covering said source and drain regions, said channel region and said control gate region, a polysilicon floating gate layer arranged on said gate oxide layer above said control gate region and said channel region and partially extending above said source and drain regions, lightly doped N– regions on said source and drain regions at the sides of and aligned with said floating gate layer and oxide spacers at the sides of the floating gate layer above portions of said lightly doped N– regions.

2. An N-channel non-volatile memory cell comprising:

a P type semiconductor substrate;

heavily doped N+ source and drain regions extending from a surface of the substrate into the substrate, and defining a channel region therebetween;

a heavily doped N+ control gate region extending from the surface of the substrate into the substrate;

a gate oxide layer overlying the source and drain regions, the channel region, and the control gate region;

a floating gate layer overlying the gate oxide layer, and extending over the channel region and over a portion of the source and drain regions; and lightly doped N– regions formed within the source and drain regions, the lightly doped N– regions being aligned with the floating gate layer and extending away from the channel region.

3. The memory cell according to claim 2 wherein the channel region is implanted with a P type dopant to raise a threshold voltage of the memory cell.

4. The memory cell according to claim 2, further comprising oxide spacers at the sides of the floating gate layer and overlying a portion of the lightly doped N– regions.

5. The memory cell according to claim 2, wherein the lightly doped N– regions are formed by ion implantation.

6. The N-channel single polysilicon level EPROM cell according to claim 1, wherein the channel region is implanted with a P type dopant to raise a threshold voltage of the N-channel single polysilicon level EPROM cell.

* * * * *